(12) United States Patent
Iwashita et al.

(10) Patent No.: US 11,450,512 B2
(45) Date of Patent: Sep. 20, 2022

(54) PLASMA PROCESSING METHOD

(71) Applicant: Tokyo Electron Limited, Tokyo (JP)

(72) Inventors: Shinya Iwashita, Nirasaki (JP); Takamichi Kikuchi, Nirasaki (JP); Naotaka Noro, Nirasaki (JP); Toshio Hasegawa, Nirasaki (JP); Tsuyoshi Moriya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 185 days.

(21) Appl. No.: 16/754,402

(22) PCT Filed: Sep. 26, 2018

(86) PCT No.: PCT/JP2018/035654
§ 371 (c)(1),
(2) Date: Apr. 8, 2020

(87) PCT Pub. No.: WO2019/073798
PCT Pub. Date: Apr. 18, 2019

(65) Prior Publication Data
US 2021/0142982 A1    May 13, 2021

(30) Foreign Application Priority Data
Oct. 10, 2017   (JP) .............................. JP2017-196630

(51) Int. Cl.
*H01J 37/32* (2006.01)
*H01J 37/20* (2006.01)

(52) U.S. Cl.
CPC .......... *H01J 37/3244* (2013.01); *H01J 37/20* (2013.01); *H01J 37/32174* (2013.01)

(58) Field of Classification Search
CPC .............. H01J 37/3244; H01J 37/3299; H01J 37/32082; H01J 37/32091; H01J 37/32165; H01J 37/32174
See application file for complete search history.

(56) References Cited

U.S. PATENT DOCUMENTS 9,136,094 B2 *   9/2015  Cho ................... H01L 21/67069
9,593,411 B2 *   3/2017  Hoffman ............. H01J 37/3266
11,195,706 B2 * 12/2021  Marakhtanov .... H01J 37/32935
(Continued)

FOREIGN PATENT DOCUMENTS

JP         10-144668 A        5/1998
JP         2007-81208 A       3/2007

*Primary Examiner* — Tung X Le
(74) *Attorney, Agent, or Firm* — Nath, Goldberg & Meyer; Jerald L. Meyer; Tanya E. Harkins

(57) ABSTRACT

A plasma processing method according to an embodiment is performed in a state in which a substrate is placed on a support stage in an internal space of a chamber body. In the plasma processing method, a plasma treatment is performed on the substrate. Subsequently, a phase of a voltage of a lower electrode is relatively adjusted with respect to a phase of a voltage of an upper electrode by a phase adjustment circuit, such that a thickness of a sheath between the support stage and plasma without extinguishing the plasma generated in order to perform the plasma treatment. Thereafter, in a state in which supply of a high-frequency power is stopped, gases and particles in the internal space of the chamber body are discharged using an exhaust device.

2 Claims, 12 Drawing Sheets

(56) References Cited

U.S. PATENT DOCUMENTS

| 2005/0082006 | A1* | 4/2005 | Kaji | H01L 21/67069 |
|---|---|---|---|---|
| | | | | 156/345.47 |
| 2008/0251206 | A1* | 10/2008 | Nishio | C23F 4/00 |
| | | | | 156/345.24 |
| 2014/0195033 | A1* | 7/2014 | Lyndaker | H01J 37/32935 |
| | | | | 700/121 |

* cited by examiner

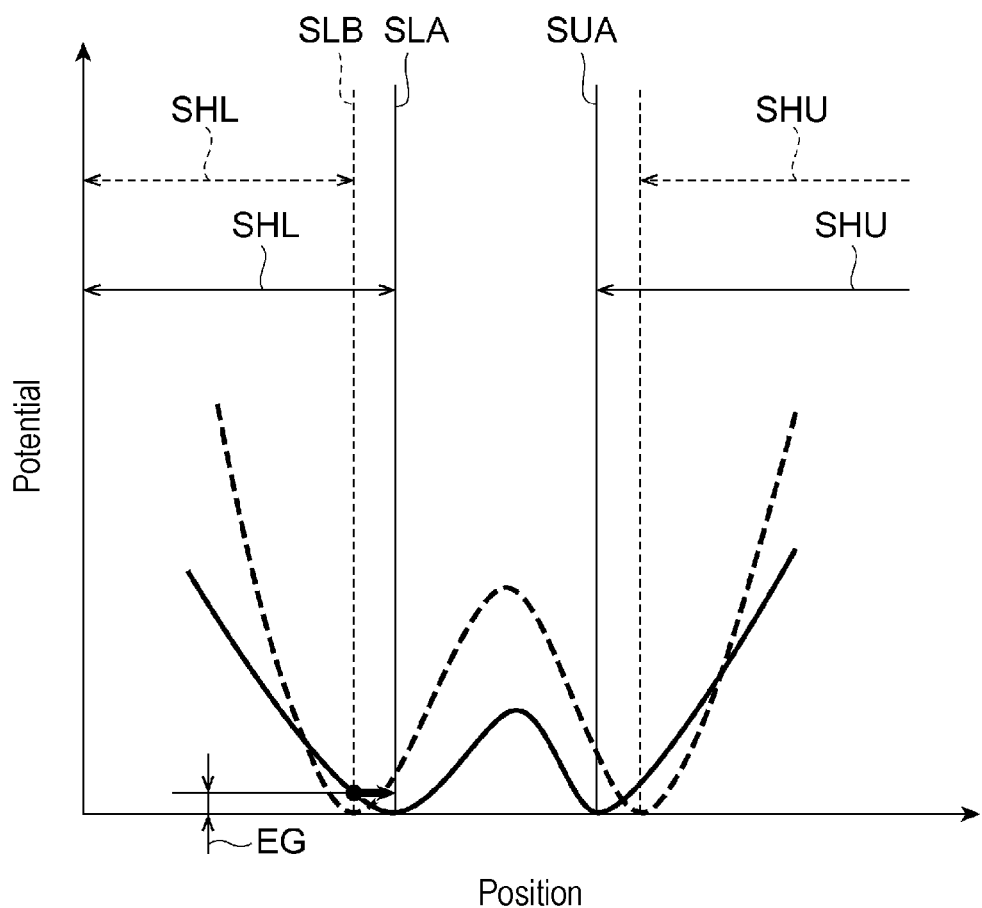

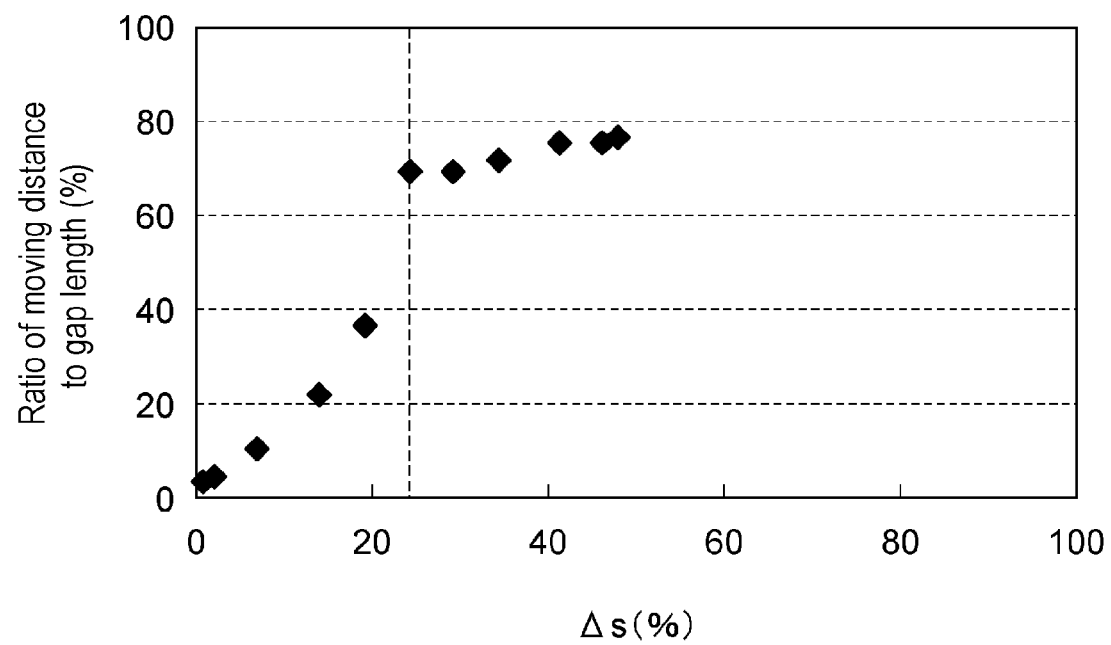

PLASMA PROCESSING METHOD

This is a National Phase application filed under 35 U.S.C. 371 as a national stage of PCT/JP2018/035654, filed Sep. 26, 2018, an application claiming the benefit of Japanese Application No. 2017-196630, filed Oct. 10, 2017, the content of each of which is hereby incorporated by reference in its entirety.

TECHNICAL FIELD

Embodiments of the present disclosure relate to a plasma processing method.

BACKGROUND

In manufacturing an electronic device, a plasma treatment is performed in order to process a substrate. In the plasma treatment, a gas is supplied to and excited in the internal space of a chamber body. As a result, plasma is generated in the chamber body. The substrate is processed by the generated plasma.

The plasma treatment or the like causes particles to be generated in the internal space. It is undesirable for the particles to adhere to the plasma-processed substrate. Accordingly, it is necessary to reduce the number of particles adhering to the plasma-processed substrate. Patent Documents 1 and 2 disclose techniques for reducing the number of particles adhering to a plasma-processed substrate.

In the technique disclosed in Patent Document 1, a microwave power is set to be a relatively low power before the microwave power is set to be zero after a plasma treatment. As a result, the thickness of a sheath increases between the plasma and a substrate support. As the thickness of the sheath increases, particles are separated upward from the plasma-processed substrate. Since the particles are separated from the plasma-processed substrate, the number of particles adhering to the substrate is reduced.

In the technique disclosed in Patent Document 2, a high-frequency power for plasma generation and a high-frequency power for bias are reduced after a plasma treatment. As a result, the shape of a sheath changes, and particles are separated from the plasma-processed substrate. Since the particles are separated from the plasma-processed substrate, the number of particles adhering to the substrate is reduced.

PRIOR ART DOCUMENTS

Patent Documents (Patent Document 1) Japanese laid-open publication No. H10-144668
(Patent Document 2) Japanese laid-open publication No. 2007-81208

In conventional techniques for reducing the number of particles adhering to a plasma-processed substrate, power is reduced in order to change a thickness of a sheath. However, the power reduction alone cannot significantly increase the thickness of the sheath. The amount of increase in the sheath thickness affects the amount of reduction in the number of particles. Accordingly, it is necessary to significantly reduce the number of particles adhering to the plasma-processed substrate.

SUMMARY

In one aspect, a plasma processing method performed in a plasma processing apparatus is provided. The plasma processing apparatus includes a chamber body, a gas supply, a support stage, an upper electrode, a high-frequency power supply, a phase adjustment circuit, and an exhaust device. The gas supply is configured to supply a gas to an internal space provided in the chamber body. The support stage includes a lower electrode. The support stage is provided in the internal space, and is configured to support a substrate placed thereon. The upper electrode is provided above the support stage. The high-frequency power supply is configured to supply a high-frequency power so as to generate plasma in the internal space. The phase adjustment circuit is configured to relatively adjust a phase of a voltage of the lower electrode with respect to a phase of a voltage of the upper electrode. The exhaust device is provided so as to be in communication with the internal space. The plasma processing method according to the aspect is performed in a state in which a substrate is placed on the support stage. The plasma processing method includes: (i) a process of performing a plasma treatment on the substrate, in which the gas is supplied from the gas supply to the internal space, and the high-frequency power is supplied from the high-frequency power supply so as to excite the gas to generate plasma, such that the plasma treatment is performed; (ii) a process of relatively adjusting the phase of the voltage of the lower electrode with respect to the phase of the voltage of the upper electrode by the phase adjustment circuit so as to increase a thickness of a sheath between the support stage and the plasma without extinguishing the plasma generated in the process of performing the plasma treatment; and (iii) a process of discharging gases and particles in the internal space using the exhaust device, after the process of adjusting the phase is performed and in a state in which supply of the high-frequency power is stopped.

The thickness of the sheath has a positive correlation with a potential difference between the plasma and the electrode, and has a negative correlation with a density of the plasma at the interface between the sheath and the plasma. When a high-frequency power is reduced, the density of the plasma at the interface between the sheath and the plasma is reduced, but at the same time, the potential difference between the plasma and the electrode is also reduced. Accordingly, the thickness of the sheath between the support stage and the plasma cannot be significantly increased by reducing the high-frequency power only. In contrast, in the plasma processing method according to the aspect, the phase of the voltage of the lower electrode is relatively adjusted with respect to the phase of the voltage of the upper electrode so as to increase the thickness of the sheath between the support stage and the plasma. By relatively adjusting the phase of the voltage of the lower electrode with respect to the phase of the voltage of the upper electrode, it is possible to increase the potential difference between the plasma and the electrode (lower electrode) without substantially changing the plasma density at the interface between the sheath and the plasma. Therefore, according to the method of the aspect, it is possible to significantly increase the thickness of the sheath between the support stage and the plasma without extinguishing the plasma generated for performing the plasma treatment, and thus it is possible to significantly separate particles upward from the plasma-processed substrate. As a result, the number of particles adhering to the plasma-processed substrate is significantly reduced.

In the process of adjusting the phase according to an embodiment, the phase of the voltage of the lower electrode is relatively adjusted with respect to the phase of the voltage of the upper electrode by the phase adjustment circuit, such that the sheath has a thickness of 1.246 times or more a thickness of the sheath during the process of performing the plasma treatment and before the process of adjusting the phase. According to this embodiment, it is possible to significantly increase a moving distance of the particles.

In an embodiment, the upper electrode includes a first portion extending above the support stage and a second portion extending above a space between the support stage and the sidewall of the chamber body. The second portion protrudes downward with respect to the first portion. In this embodiment, particles separated upward from the substrate further move to a region outside a region above the support stage, and are then discharged. Therefore, the number of particles adhering to the plasma-processed substrate is further significantly reduced.

As described above, it is possible to significantly reduce the number of particles adhering to the plasma-processed substrate.

BRIEF DESCRIPTION OF DRAWINGS

FIG. 8 is a view illustrating movement of particles generated by adjusting a high-frequency power.

FIG. 11 is a view illustrating experimental results.

DETAILED DESCRIPTION

Figure 1:
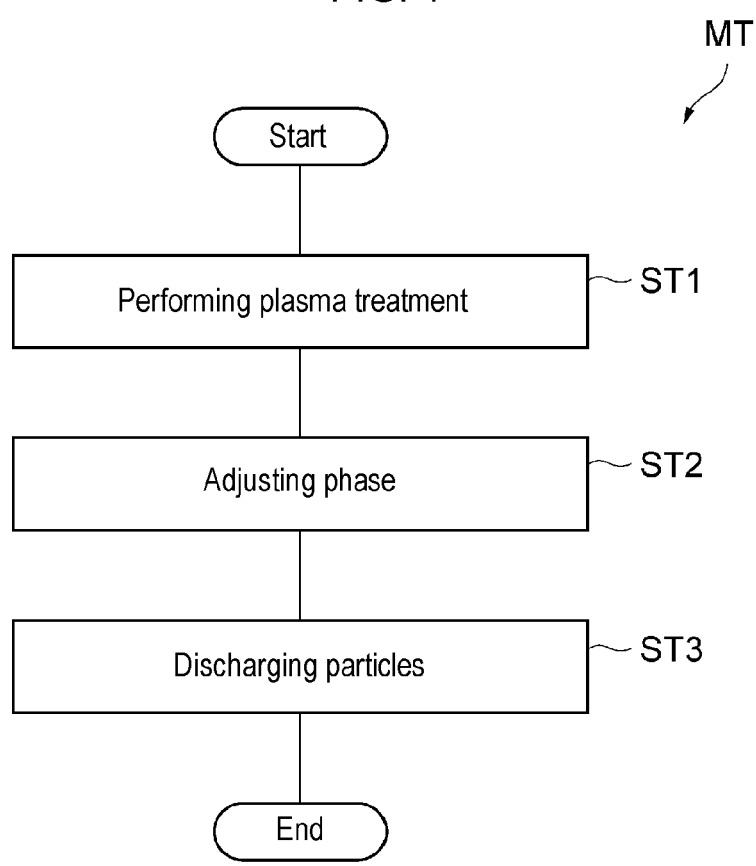
FIG. 1 is a flowchart illustrating a plasma processing method according to an embodiment.

Hereinafter, various embodiments will be described in detail with reference to the drawings. In the drawings, the same or corresponding parts will be denoted by the same reference numerals.

FIG. 1 is a flowchart illustrating a plasma processing method according to an embodiment. In the plasma processing method illustrated in FIG. 1 (hereinafter, referred to as "method MT"), a plasma treatment is performed on a substrate using a plasma processing apparatus.

Figure 2:
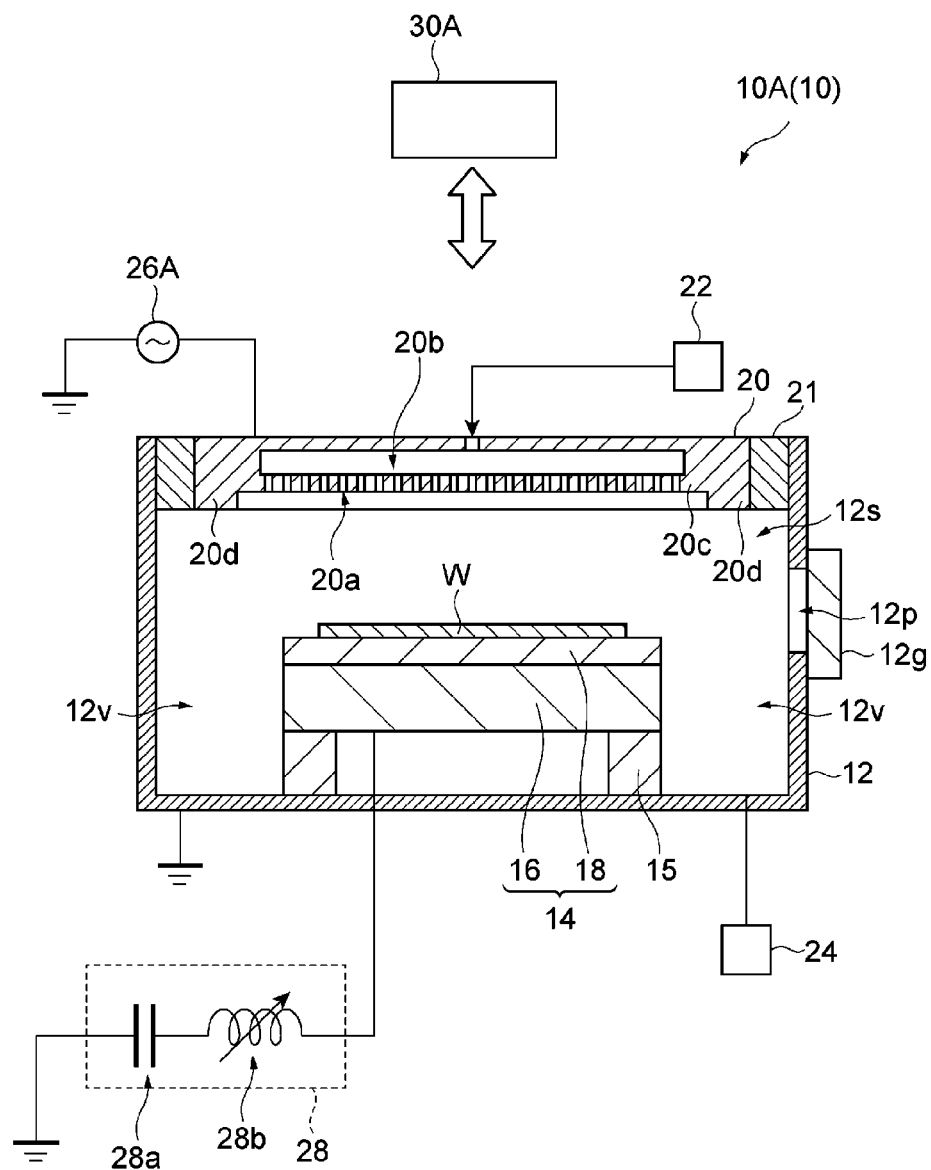
FIG. 2 is a view illustrating a plasma processing apparatus according to an embodiment, which can be used in performing the method illustrated in FIG. 1.

FIG. 2 is a view illustrating a plasma processing apparatus according to an embodiment, which can be used in performing the method shown in FIG. 1. A plasma processing apparatus 10A illustrated in FIG. 2 is a capacitively-coupled plasma processing apparatus. The plasma processing apparatus 10A includes a chamber body 12. The chamber body 12 has a substantially cylindrical shape, and extends in the vertical direction. The chamber body 12 has a substantially cylindrical sidewall portion, and a bottom portion continuous with the lower end of the sidewall portion. The chamber body 12 provides an internal space 12s. The chamber body 12 is formed of metal such as aluminum. A plasma-resistant coating is formed on the inner wall surface of the chamber body 12. The plasma-resistant coating may be a ceramic film such as an alumite film or an yttrium oxide film. The chamber body 12 is grounded.

A passage 12p is formed in the sidewall portion of the chamber body 12. The substrate W passes through the passage 12p when transported from the outside of the chamber body 12 to the internal space 12s and when transported from the internal space 12s to the outside of the chamber body 12. The passage 12p is opened and closed by a gate valve 12g. The gate valve 12g is provided along the sidewall portion of the chamber body 12.

A support stage 14 is provided in the internal space 12s of the chamber body. The support stage 14 is configured to support a substrate W placed thereon. The support stage 14 is supported by a support 15. The support 15 has an insulating property and extends upward from the bottom portion of the chamber body 12.

The support stage 14 includes a lower electrode 16. The lower electrode 16 has a substantially disk-like shape. The lower electrode 16 is formed of a conductive material such as aluminum. In the present embodiment, the support stage 14 further includes an electrostatic chuck 18. The electrostatic chuck 18 is provided on the lower electrode 16. The substrate W is placed on the electrostatic chuck 18. The electrostatic chuck 18 includes a dielectric film and an electrode embedded in the dielectric film. The electrode of the electrostatic chuck 18 may be a conductive film. A power supply is connected to the electrode of the electrostatic chuck 18 via a switch. When a voltage is applied to the electrode of the electrostatic chuck 18 from the power supply, an electrostatic attractive force is generated between the electrostatic chuck 18 and the substrate W. The substrate W is attracted to the electrostatic chuck 18 by the generated electrostatic attractive force, and is held by the electrostatic chuck 18.

An upper electrode 20 is provided above the support stage 14. A portion of the internal space 12s is interposed between the upper electrode 20 and the support stage 14. In the present embodiment, an upper end portion of the chamber body 12 is open. The upper electrode 20 is supported on the upper end portion of the chamber body 12 via a member 21. The member 21 has an insulating property. The upper electrode 20 closes the opening in the upper end portion of the chamber body 12, together with the member 21.

The upper electrode 20 is formed of one or more conductive components. The one or more components constituting the upper electrode 20 may be formed of a material such as aluminum or silicon. Alternatively, the upper electrode 20 may be formed of one or more conductive components and one or more insulating components. A plasma-resistant film may be formed on the surface of the upper electrode 20.

The upper electrode 20 is provided with a plurality of gas ejection holes 20a and a gas diffusion chamber 20b. The plurality of gas ejection holes 20a extends downward from the gas diffusion chamber 20b to the lower surface of the upper electrode 20 facing the internal space 12s. A gas supply 22 is connected to the gas diffusion chamber 20b. The gas supply 22 is configured to supply a gas to the internal space 12s. The gas supply 22 includes, for example, a plurality of gas sources, a plurality of flow controllers such as mass flow controllers, and a plurality of valves. Each of the plurality of gas sources is connected to the gas diffusion chamber 20b via a corresponding one of the plurality of flow controllers and a corresponding one of the plurality of valves. The gas supply 22 adjusts a flow rate of a gas from a gas source, which is selected from the plurality of gas sources, and supplies the gas to the gas diffusion chamber 20b. The gas supplied to the gas diffusion chamber 20b is supplied to the internal space 12s from the plurality of gas ejection holes 20a.

In the present embodiment, the upper electrode 20 includes a first portion 20c and a second portion 20d. The first portion 20c extends above the support stage 14. That is, the first portion 20c and the support stage 14 face each other in the vertical direction. The plurality of gas ejection holes 20a described above is provided in the first portion 20c. The second portion 20d extends above a space 12v. The space 12v is a part of the internal space 12s and extends between the support stage 14 and the sidewall portion of the chamber body 12. That is, the second portion 20d extends in the circumferential direction outside the first portion 20c. The second portion 20d protrudes downward with respect to the first portion 20c.

An exhaust device 24 is connected to the bottom portion of the chamber body 12. The exhaust device 24 is provided so as to be in communication with the internal space 12s. The exhaust device 24 has a pressure control device such as a pressure regulating valve, and a vacuum pump such as a turbo molecular pump and a dry pump. By operating the exhaust device 24, the gas present in the internal space 12s is exhausted through the space 12v between the support stage 14 and the sidewall portion of the chamber body 12. Further, the pressure in the internal space 12s is adjusted to a specific pressure by the exhaust device 24.

The plasma processing apparatus 10A further includes a high-frequency power supply 26A. The high-frequency power supply 26A is configured to supply a high-frequency power in order to generate plasma in the internal space 12s. In the present embodiment, the high-frequency power supply 26A is electrically connected to the upper electrode 20. When the high-frequency power is supplied from the high-frequency power supply 26A, a high-frequency electric field is formed in the space between the upper electrode 20 and the lower electrode 16. The gas is excited in the space between the upper electrode 20 and the lower electrode 16 by the formed high-frequency electric field. As a result, plasma is generated in the internal space 12s.

The plasma processing apparatus 10A further includes a phase adjustment circuit 28. The phase adjustment circuit 28 is configured to relatively adjust a phase of a voltage of the lower electrode 16 with respect to a phase of a voltage of the upper electrode 20. In the present embodiment, the phase adjustment circuit 28 is electrically connected to the lower electrode 16. In the present embodiment, the phase adjustment circuit 28 includes a capacitor 28a and a variable inductor 28b. The capacitor 28a and the variable inductor 28b are connected in series between the lower electrode 16 and the ground. In the present embodiment, one end of the capacitor 28a is grounded. The other end of the capacitor 28a is connected to one end of the variable inductor 28b. The other end of the variable inductor 28b is electrically connected to the lower electrode 16.

By adjusting the inductance of the variable inductor 28b, the phase of the voltage of the lower electrode 16 is relatively adjusted with respect to the phase of the voltage of the upper electrode 20. That is, a phase difference between the voltage of the upper electrode 20 and the voltage of the lower electrode 16 is determined by the inductance of the variable inductor 28b. When the phase difference between the voltage of the upper electrode 20 and the voltage of the lower electrode 16 is small, a potential difference between the plasma and the support stage 14 decreases, and thus the thickness of the sheath decreases. Meanwhile, when the phase difference between the voltage of the upper electrode 20 and the voltage of the lower electrode 16 is large, a self-bias potential of the lower electrode 16 decreases (that is, the self-bias potential has a negative polarity and a large absolute value), the potential difference (sheath voltage) between the plasma and the support stage 14 increases, and thus the thickness of the sheath increases.

The plasma processing apparatus 10A may further include a controller 30A. The controller 30A is configured to control the respective components of the plasma processing apparatus 10A. The controller 30A may be a computer device, and may include a processor, a storage device such as a memory, an input device such as a keyboard, a mouse, or a touch panel, a display device, a signal input/output interface, and the like. A storage device of the controller 30A stores a control program and recipe data. The processor of the controller 30A executes the control program and controls the respective components of the plasma processing apparatus 10A according to the recipe data. The method MT is performed by controlling the respective components of the plasma processing apparatus 10A by the controller 30A.

Figure 3:
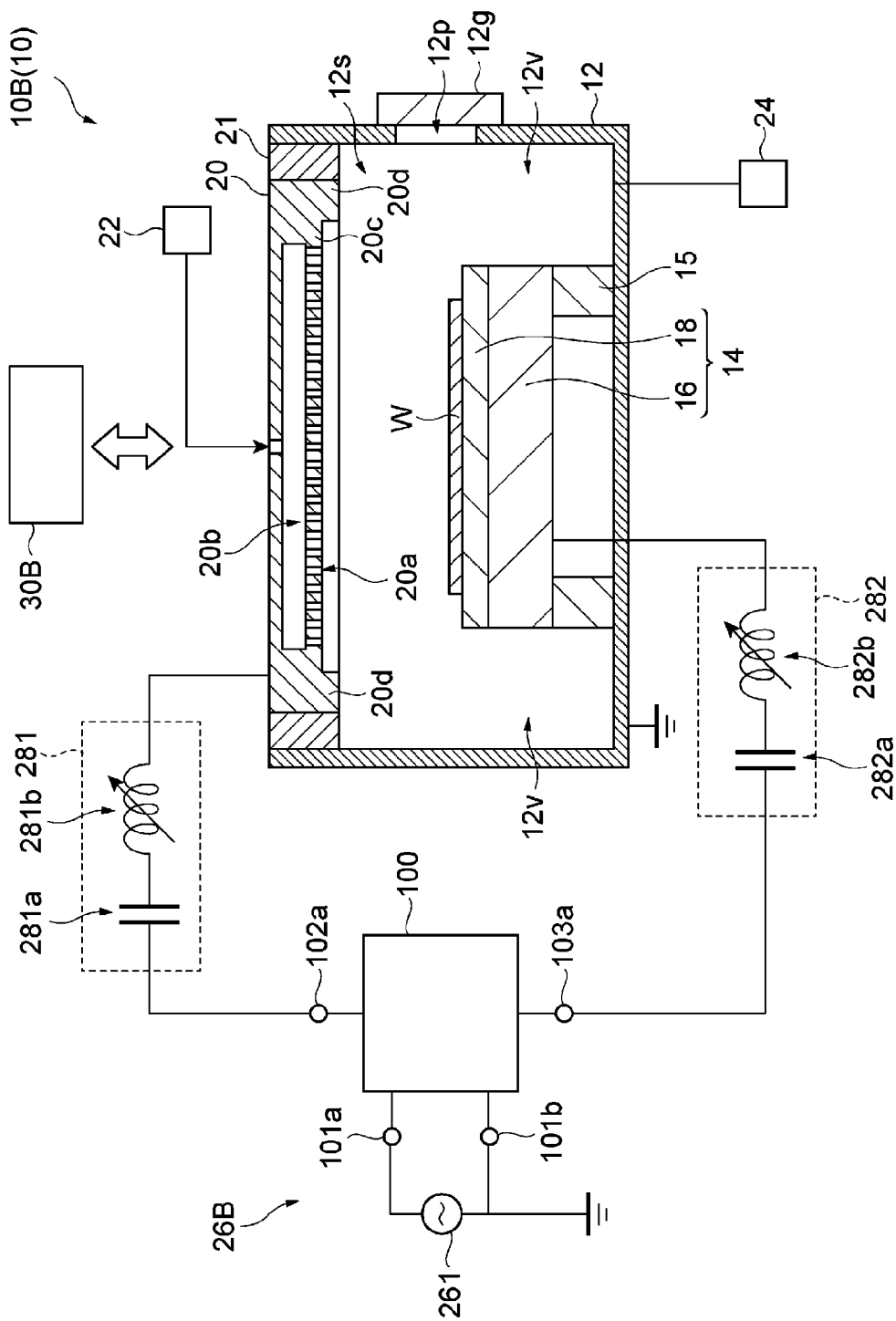
FIG. 3 is a view illustrating a plasma processing apparatus of another embodiment, which can be used in performing the method illustrated in FIG. 1.

FIG. 3 is a view illustrating a plasma processing apparatus of another embodiment, which can be used in performing the method illustrated in FIG. 1. A plasma processing apparatus 10B illustrated in FIG. 3 includes a high-frequency power supply part 26B, a phase adjustment circuit 281, a phase adjustment circuit 282, and a controller 30B, instead of the high-frequency power supply 26A, the phase adjustment circuit 28, and the controller 30A in the plasma processing apparatus 10A. Other components of the plasma processing apparatus 10B are the same as corresponding components of the plasma processing apparatus 10A.

The high-frequency power supply part 26B generates a first high-frequency power and a second high-frequency power. The first high-frequency power is a high-frequency power supplied to the upper electrode 20. The second high-frequency power is a high-frequency power supplied to the lower electrode 16, and have the same frequency as the first high-frequency power. The high-frequency power supply part 26B is configured to adjust a ratio of the second high-frequency power to the first high-frequency power.

The controller 30B may be a computer device, and may include a processor, a storage device such as a memory, an input device such as a keyboard, a mouse, or a touch panel, a display device, a signal input/output interface, and the like. A storage device of the controller 38B stores a control program and recipe data. The processor of the controller 30B executes the control program and controls the respective components of the plasma processing apparatus 10B according to the recipe data. The method MT is performed by controlling the respective components of the plasma processing apparatus 10B by the controller 30B.

In the present embodiment, the high-frequency power supply part 26B includes a high-frequency power supply 261 and a transformer 100. The high-frequency power supply 261 is configured to generate a high-frequency power. The high-frequency power from the high-frequency power supply 261 is supplied to the primary coil of the transformer 100.

Figure 4:
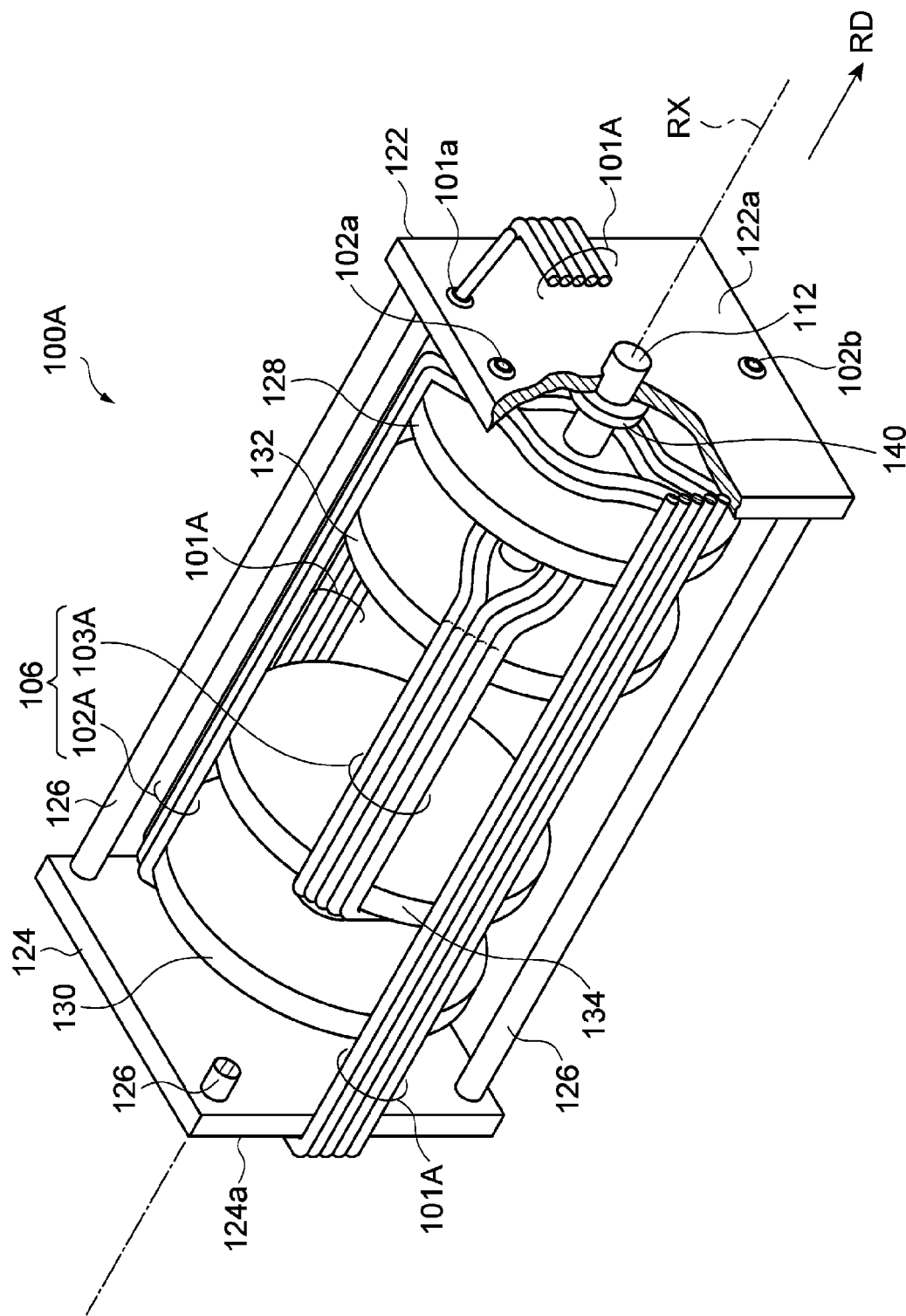
FIG. 4 is a perspective view illustrating a partially cut-out transformer, which can be used as a transformer of the plasma processing apparatus illustrated in FIG. 3.
Figure 5:
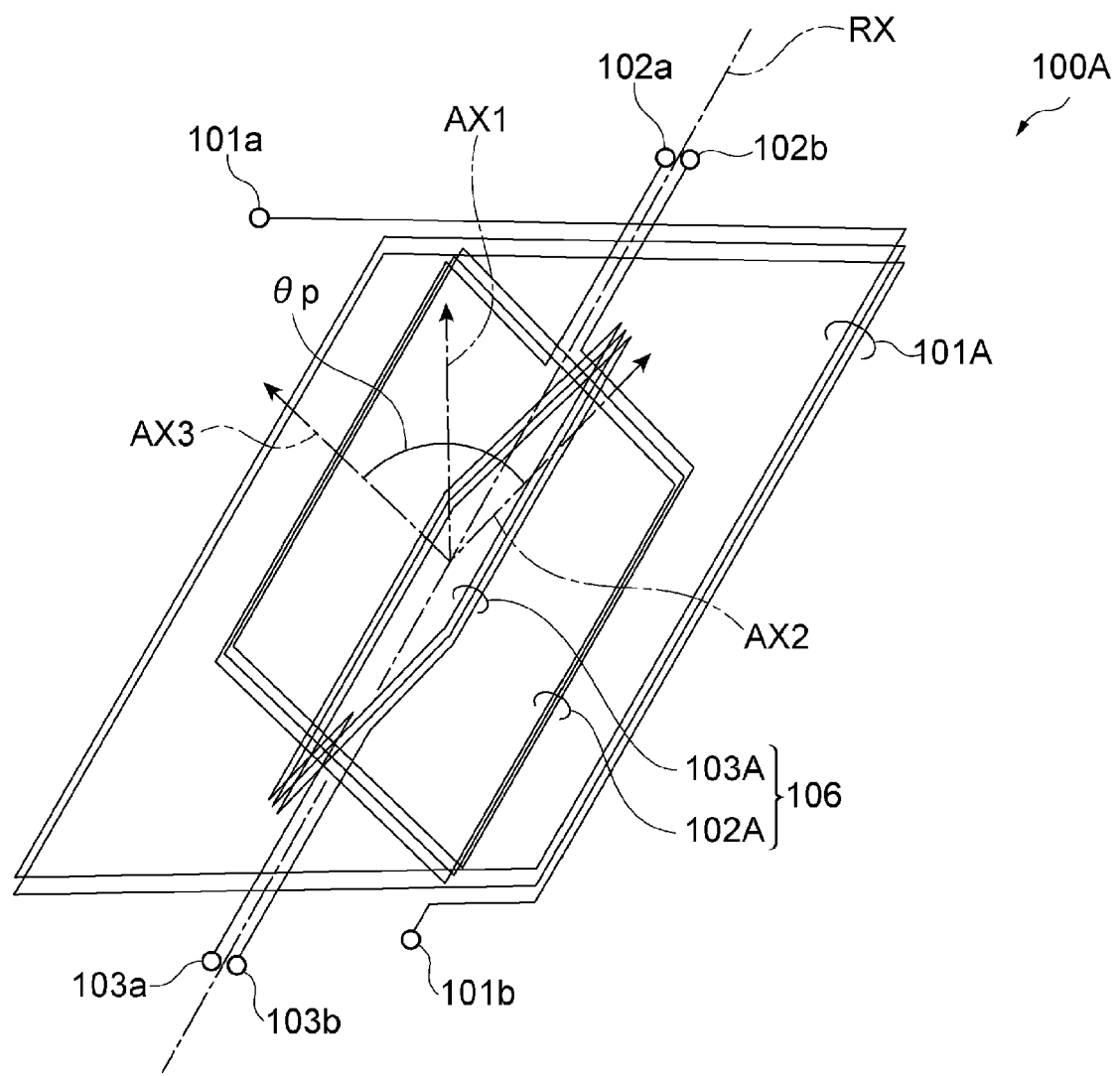
FIG. 5 is a view schematically illustrating three coils of the transformer illustrated in FIG. 4.

FIG. 4 is a perspective view illustrating a partially cut-out transformer, which can be used as a transformer of the plasma processing apparatus illustrated in FIG. 3. FIG. 5 is a view schematically illustrating three coils of the transformer illustrated in FIG. 4. A transformer 100A illustrated in FIGS. 4 and 5 may be used as the transformer 100 of the plasma processing apparatus 10B. The transformer 100A includes a rotary shaft 112, a primary coil 101A, a first secondary coil 102A, and a second secondary coil 103A. The first secondary coil 102A and the second secondary coil 103A constitute a secondary coil pair 106. In the present embodiment, the transformer 100A further includes a support 122, a support 124, columns 126, a support 128, a support 130, a support 132, a support 134, a terminal 101a, a terminal 101b, a terminal 102a, a terminal 102b, a terminal 103a, and a terminal 103b.

The rotary shaft 112 has a substantially columnar shape. The rotary shaft 112 is provided so as to be rotatable around the central axis RX thereof. In the present embodiment, the rotary shaft 112 is rotatably supported by the supports 122 and 124. The supports 122 and 124 are plate-shaped members and have a substantially rectangular planar shape. The supports 122 and 124 are formed of an insulator. The supports 122 and 124 are provided so as to intersect or to be substantially orthogonal to the central axis RX, and are arranged in the direction RD in which the central axis RX extends such that the plate thickness directions of the supports 122 and 124 substantially coincide with the direction RD. One end of each of the column 126 is fixed to a corner of the support 122, and the other end of each of the column 126 is fixed to a corner of the support 124. One end of the rotary shaft 112 penetrates the support 122 and protrudes from the support 122. The one end of the rotary shaft 112 is connected to a driving mechanism (e.g., a motor).

The supports 128 and 130 are substantially disk-shaped members, and are formed of an insulator. The supports 128 and 130 are provided between the support 122 and the support 124 so as to intersect or to be substantially orthogonal to the central axis RX, and are arranged in the direction RD such that the plate thickness directions of the supports 128 and 130 substantially coincide with the direction RD. The supports 132 and 134 are substantially disk-shaped members, and are formed of an insulator. The supports 132 and 134 are provided between the support 128 and the support 130 so as to intersect or to be substantially orthogonal to the central axis RX, and are arranged in the direction RD such that the plate thickness directions of the supports 132 and 134 substantially coincide with the direction RD. The rotary shaft 112 passes through the center of each of the support 128, the support 130, the support 132, and the support 134. The support 128, the support 130, the support 132, and the support 134 are fixed to the rotary shaft 112.

The primary coil 101A extends around a first axis AX1 orthogonal to the central axis RX. In the present embodiment, the first axis AX1 is orthogonal to the central axis RX in the middle between the supports 122 and 124. The primary coil 101A is wound around the center of the first axis AX1 so as to alternately pass outside the support 122 and outside the support 124.

One end of the primary coil 101A is connected to the terminal 101a. In the present embodiment, the terminal 101a is provided on one surface 122a of the support 122 (the surface facing the outside of the transformer 100A). The other end of the primary coil 101A is connected to the terminal 101b. In the present embodiment, the terminal 101b is provided on one surface 124a of the support 124 (the surface facing the outside of the transformer 100A).

The first secondary coil 102A extends around a second axis AX2. The second axis AX2 is orthogonal to the central axis RX in a region surrounded by the primary coil 101A. In the present embodiment, the second axis AX2 is orthogonal to the central axis RX in the middle between the supports 128 and 130. The first secondary coil 102A is wound around the center of the second axis AX2 so as to alternately pass outside the support 128 and outside the support 130. The first secondary coil 102A is supported by the rotary shaft 112 via the support 128 and the support 130.

One end of the first secondary coil 102A is connected to the terminal 102a. The other end of the first secondary coil 102A is connected to the terminal 102b. In the present embodiment, the terminals 102a and 102b are provided on one surface 122a of the support 122. The rotary shaft 112 includes a first conductor and a second conductor, which are provided coaxially. One end of the first secondary coil 102A is connected to the first conductor, and the other end of the first secondary coil 102A is connected to the second conductor. The first conductor is connected to the terminal 102a via a slip ring in a rotary connector 140. The second conductor is connected to the terminal 102b via another slip ring in the rotary connector 140.

The second secondary coil 103A extends around a third axis AX3. The third axis AX3 is orthogonal to the central axis RX in the region surrounded by the primary coil 101A. The third axis AX3 intersects the second axis AX2. The third axis AX3 and the second axis AX2 form a predetermined angle θp therebetween. The angle θp is, for example, 90 degrees, but not limited thereto. In the present embodiment, the third axis AX3 is orthogonal to the central axis RX in the middle between the supports 132 and 134. The second secondary coil 103A is wound around the center of the third axis AX3 so as to alternately pass outside the support 132 and outside the support 134. The second secondary coil 103A is supported by the rotary shaft 112 via the support 132 and the support 134. An insulation distance is ensured between the second secondary coil 103A and the first secondary coil 102A.

One end of the second secondary coil 103A is connected to the terminal 103a. The other end of the second secondary coil 103A is connected to the terminal 103b. In the present embodiment, the terminals 103a and 103b are provided on one surface 124a of the support 124. The rotary shaft 112 includes a third conductor and a fourth conductor, which are provided coaxially. One end of the second secondary coil 103A is connected to the third conductor, and the other end of the second secondary coil 103A is connected to the fourth conductor. The third conductor is connected to the terminal 103a via a slip ring of another rotary connector provided near the support 124. The fourth conductor is connected to the terminal 103b via another slip ring in the another rotary connector.

When the transformer 100A is used as the transformer 100 of the plasma processing apparatus 10B, the terminals 101a and 101b are electrically connected to the high-frequency power supply 261 as illustrated in FIG. 3. In addition, the terminal 101b is electrically grounded. The terminal 102a is electrically connected to the upper electrode 20 via the phase adjustment circuit 281. The terminal 103a is electrically connected to the lower electrode 16 via the phase adjustment circuit 282. The terminals 102b and 103b are electrically grounded.

The phase adjustment circuit 281 and the phase adjustment circuit 282 are configured to relatively adjust the phase of the voltage of the lower electrode 16 with respect to the phase of the voltage of the upper electrode 20. The phase adjustment circuit 281 is electrically connected to the upper electrode 20. In the present embodiment, the phase adjustment circuit 281 includes a capacitor 281a and a variable inductor 281b. The capacitor 281a and the variable inductor 281b are connected in series between the upper electrode 20 and the terminal 102a. In the present embodiment, one end of the capacitor 281a is connected to the terminal 102a. The other end of the capacitor 281a is connected to one end of the variable inductor 281b. The other end of the variable inductor 281b is electrically connected to the upper electrode 20.

The phase adjustment circuit 282 is electrically connected to the lower electrode 16. In the present embodiment, the phase adjustment circuit 282 includes a capacitor 282a and a variable inductor 282b. The capacitor 282a and the variable inductor 282b are connected in series between the lower electrode 16 and the terminal 103a. In the present embodiment, one end of the capacitor 282a is connected to the terminal 103a. The other end of the capacitor 282a is connected to one end of the variable inductor 282b. The other end of the variable inductor 282b is electrically connected to the lower electrode 16.

In the case where the transformer 100A is used as the transformer 100 of the plasma processing apparatus 10B, when the high-frequency power is supplied from the high-frequency power supply 261 to the primary coil 101A, the primary coil 101A generates magnetic flux in a direction substantially parallel to the direction in which the first axis AX1 extends. By adjusting the rotation angle of the secondary coil pair 106, the amount of magnetic flux passing through the first secondary coil 102A and the amount of magnetic flux passing through the second secondary coil 103A are adjusted. An induced electromotive force is generated in the first secondary coil 102A depending on the amount of magnetic flux passing therethrough, and a first high-frequency power is output from the first secondary coil 102A. In addition, an induced electromotive force is generated in the second secondary coil 103A depending on the amount of magnetic flux passing therethrough, and a second high-frequency power is output from the second secondary coil 103A. Therefore, with the transformer 100A, it is possible to adjust the ratio of the second high-frequency power to the first high-frequency power.

In addition, by adjusting the inductance of the variable inductor of at least one of the phase adjustment circuits 281 and 282, the phase of the voltage of the lower electrode 16 is relatively adjusted with respect to the phase of the voltage of the upper electrode 20. That is, the phase difference between the voltage of the lower electrode 16 and the voltage of the upper electrode 20 is determined by the inductance of the variable inductor of at least one of the phase adjustment circuits. When the phase difference between the voltage of the upper electrode 20 and the voltage of the lower electrode 16 is small, the potential difference between the plasma and the support stage 14 decreases, and thus the thickness of the sheath decreases. Meanwhile, when the phase difference between the voltage of the upper electrode 20 and the voltage of the lower electrode 16 is large, the self-bias potential of the lower electrode 16 decreases (that is, the self-bias potential has a negative polarity and a large absolute value), the potential difference (that is, the sheath voltage) between the plasma and the support stage 14 increases, and thus the thickness of the sheath increases.

Figure 6:
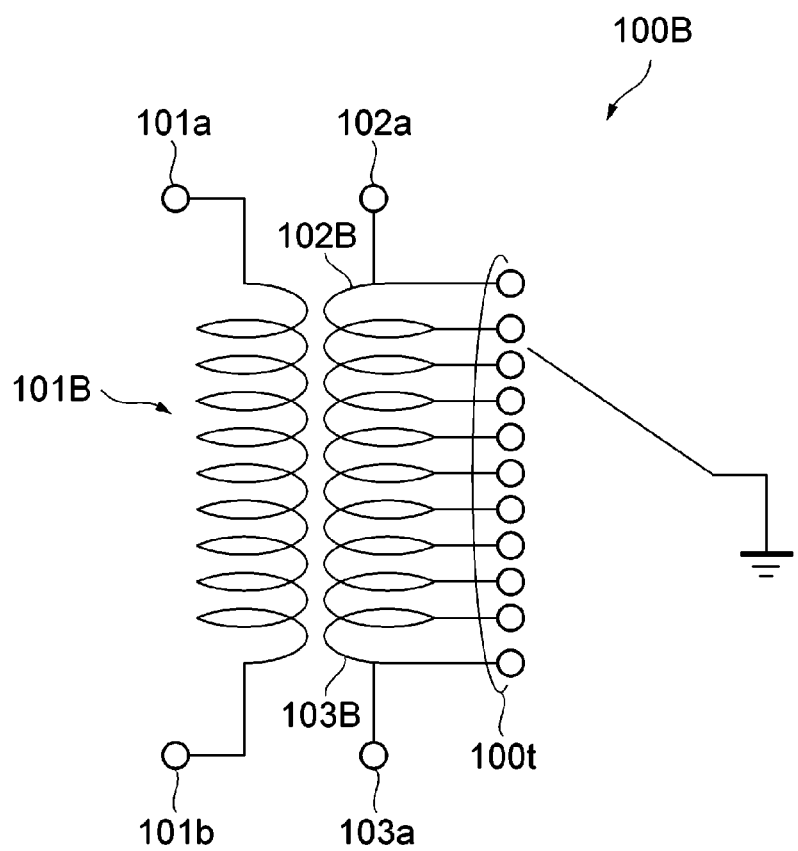
FIG. 6 is a view schematically illustrating another transformer, which can be used as a transformer of the plasma processing apparatus shown in FIG. 3.

FIG. 6 is a view schematically illustrating another transformer, which can be used as a transformer of the plasma processing apparatus shown in FIG. 3. A transformer 100B illustrated in FIG. 6 may be used as the transformer 100 of the plasma processing apparatus 10B illustrated in FIG. 3.

The transformer 100B has a primary coil 101B, a first secondary coil 102B, and a second secondary coil 103B. One end of the primary coil 101B is the terminal 101a, and the other end is the terminal 101b. The terminals 101a and 101b are connected to the high-frequency power supply 261. The terminal 101b is electrically grounded.

The first secondary coil 102B and the second secondary coil 103B are electromagnetically coupled to the primary coil 101B. One end of the first secondary coil 102B is the terminal 102a. The terminal 102a is electrically connected to the upper electrode 20 via the phase adjustment circuit 281. One end of the second secondary coil 103B is the terminal 103a. The terminal 103a is electrically connected to the lower electrode 16 via the phase adjustment circuit 282.

In the transformer 100B, the first secondary coil 102B and the second secondary coil 103B are formed from a single coil. Specifically, the secondary side of the transformer 100B has a single coil, and the single coil has a plurality of taps 100t. The plurality of taps 100t is configured to be selectively connected to the ground. In the transformer 100B, one side of the single coil becomes the first secondary coil 102B and the other side becomes the second secondary coil 103B, with respect to a tap selected to be connected to the ground. With the transformer 100B, the ratio of the second high-frequency power output from second secondary coil 103B to the first high-frequency power output from first secondary coil 102B can be adjusted.

Figure 7A:
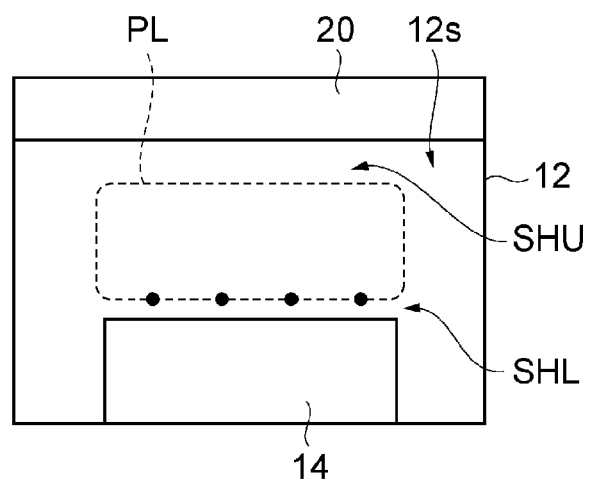
FIG. 7A is a view illustrating plasma and particles when a process ST1 illustrated in FIG. 1 is performed.
Figure 7B:
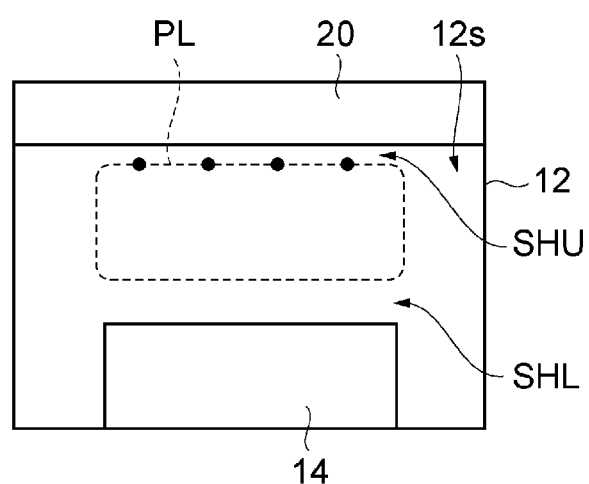
FIG. 7B is a view illustrating plasma and particles when a process ST2 illustrated in FIG. 1 is performed.
Figure 7C:
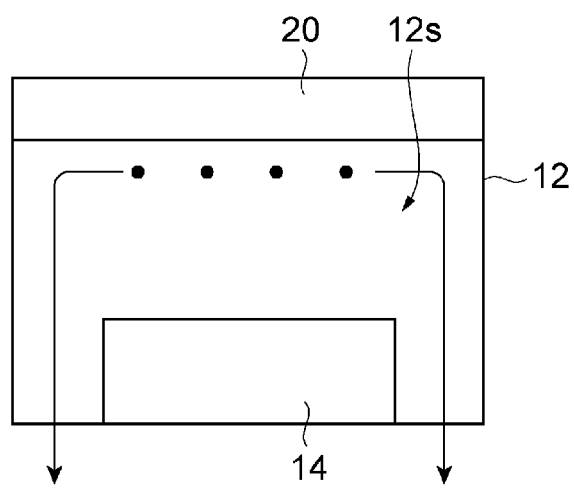
FIG. 7C is a view illustrating particles when a process ST3 illustrated in FIG. 1 is performed.

Hereinafter, the method MT will be described with reference to FIG. 1 again. In the following description, a plasma processing apparatus used for performing the method MT will be referred to as a plasma processing apparatus 10. The plasma processing apparatus 10 may be the plasma processing apparatus 10A or the plasma processing apparatus 10B. In the following description, FIG. 7A, FIG. 7B, and FIG. 7C are referred to. FIG. 7A is a view illustrating plasma and particles when a process ST1 illustrated in FIG. 1 is performed, and FIG. 7B is a view illustrating plasma and particles when a process ST2 illustrated in FIG. 1 is performed, and FIG. 7C is a view illustrating particles when a process ST3 illustrated in FIG. 1 is performed. In FIG. 7, black circles indicate particles.

The method MT is performed in a state in which a substrate W is placed on the support stage 14 of the plasma processing apparatus 10. The method MT includes the process ST1, the process ST2, and the process ST3. In the process ST1, a plasma treatment is performed on the substrate W. In the process ST1, a gas is supplied from the gas supply 22 to the internal space 12s in order to perform the plasma treatment. In the process ST1, the pressure in the internal space 12s is adjusted to a predetermined pressure by the exhaust device 24. In the process ST1, a high-frequency power is supplied from a high-frequency power supply (high-frequency power supply 26A or the high frequency power supply 261) in order to excite the gas in the internal space 12s. In the process ST1, the gas is excited in the internal space 12s, and plasma of the gas is generated. The substrate W is processed by ions and/or radicals from the generated plasma.

The plasma treatment performed in the process ST1 may be an arbitrary plasma treatment. The plasma treatment performed in the process ST1 may be a plasma etching process or a plasma-enhanced chemical vapor deposition (PECVD) process. Alternatively, the plasma treatment performed in the process ST1 may be a plasma treatment in a plasma-enhanced atomic layer deposition (PEALD) process. In the PEALD process, a sequence including supplying a precursor gas to the substrate W, performing a purge process, performing a plasma treatment, and performing a purge process is repeated. A film generated by the PEALD process is, for example, a $TiO_2$ film (titanium oxide film). When the $TiO_2$ film is formed by the PEALD process, a titanium-containing gas is used as a precursor gas, and an oxygen-containing gas is used as a gas for the plasma treatment. The titanium-containing gas may be a titanium halide gas such as titanium tetrachloride gas. The oxygen-containing gas may be an oxygen gas. In the PEALD process, the processes ST2 and ST3 are performed between the plasma treatment and the purge process in each sequence.

As illustrated in FIG. 7A, in the process ST1, plasma PL is generated in the internal space 12s. In the internal space 12s, particles are located at an end portion of the plasma PL facing the support stage 14 (that is, the upper end of a sheath SHL between the plasma PL and the support stage 14), or in the vicinity thereof. During the process ST1, a vertical distance between the lower end of the plasma PL and the support stage 14 is relatively short. Accordingly, particles exist in the vicinity of the support stage 14.

As illustrated in FIG. 1, in the method MT, the process ST2 is performed subsequently to the process ST1. In the process ST2, the phase of the voltage of the lower electrode 16 is relatively adjusted with respect to the phase of the voltage of the upper electrode 20 by a phase adjustment circuit (the phase adjustment circuit 28 or at least one of the phase adjustment circuit 281 and the phase adjustment circuit 282) so as to increase the thickness of the sheath SHL without extinguishing the plasma PL generated in the process ST1. That is, by adjusting the inductance of the variable inductor of the phase adjustment circuit, the phase difference between the voltage of the upper electrode 20 and the voltage of the lower electrode 16 is adjusted so as to increase the thickness of the sheath SHL.

In the process ST2, the thickness of the sheath SHL significantly increases from the thickness of the sheath SHL during the process ST1. As a result, particles are significantly separated upward from the support stage 14, and, as illustrated in FIG. 7B, move to an end portion of the plasma PL facing the upper electrode 20 (that is, the lower end of a sheath SHU between the plasma PL and the upper electrode 20), or in the vicinity thereof.

As illustrated in FIG. 1, in the method MT, the process ST3 is performed subsequently to the process ST2. In the process ST3, gases and particles in the internal space 12s are discharged using the exhaust device 24 in a state in which supplying the high-frequency power is stopped after performing the process ST2. That is, in the process ST3, as illustrated in FIG. 7C, the plasma is extinguished, and the particles are discharged together with the gas in the internal space 12s. As described above, in the process ST2, the particles are significantly separated upward from the support stage 14. Accordingly, the number of particles adhering to the substrate W on the support stage 14 when the particles are discharged in the process ST3 is significantly reduced.

Figure 9:
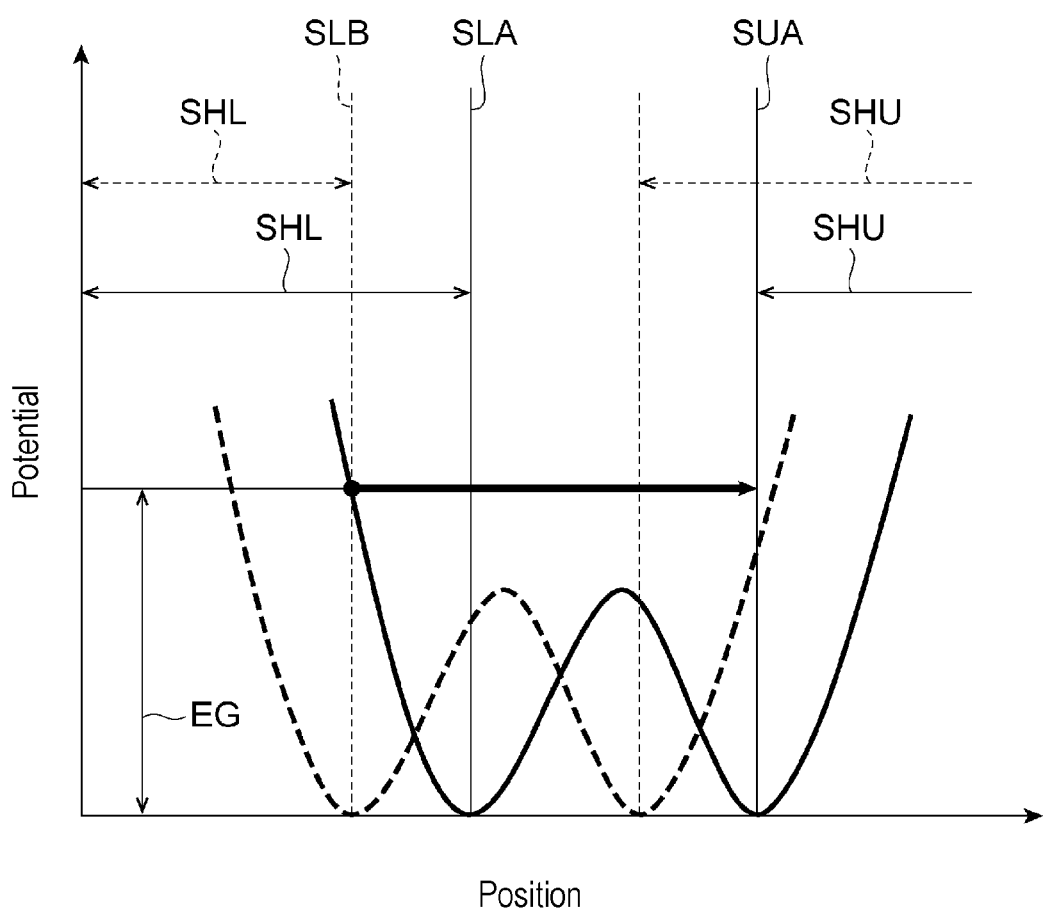
FIG. 9 is a view illustrating movement of particles generated by relatively adjusting a phase of a voltage of a lower electrode with respect to a voltage of an upper electrode.

Hereinafter, reference will be made to FIGS. 8 and 9. FIG. 8 is a view illustrating movement of particles generated by adjusting a high-frequency power, which corresponds to a comparative technique. FIG. 9 is a view illustrating movement of particles generated by relatively adjusting a phase of a voltage of a lower electrode with respect to a voltage of an upper electrode. In each of FIGS. 8 and 9, the horizontal axis represents a vertical position between the support stage 14 and the upper electrode 20. The leftward in the horizontal axis represents a direction toward the support stage 14, and the rightward in the horizontal axis represents a direction toward the upper electrode 20. In each of FIGS. 8 and 9, the vertical axis represents a potential. The potential on the vertical axis in each of FIGS. 8 and 9 represents an energy of particles, and is derived from forces (e.g., an electrostatic force, an ion drag, and the gravity) applied to the particles, a temperature gradient, and the like. In FIG. 8, a potential distribution before the high-frequency power is reduced is indicated by a dotted line, and a potential distribution when the high-frequency power is reduced is indicated by a solid line. In FIG. 9, a potential distribution during the process ST1 is indicated by a dotted line, and a potential distribution during the process ST2 is indicated by a solid line. In FIGS. 8 and 9, particles are indicated by black circles.

Particles tend to be located in places where the potential is low. Accordingly, as illustrated in FIGS. 8 and 9, before the thickness of the sheath SHL is increased, particles are located at a lower end SLB of the sheath SHL or in the vicinity thereof.

Here, the thickness of the sheath SHL formed between the plasma PL and the support stage 14 is represented by Equation (1). In Equation (1), $\varepsilon_0$ is the dielectric constant of vacuum, $V_0$ is a potential difference between the plasma and the lower electrode 16, e is an elementary charge, and $n_s$ is a density of plasma at the upper end of the sheath SHL.

[Equation 1]

$$s = \left(\frac{2\varepsilon_0 V_0}{en_s}\right)^{\frac{1}{2}} \quad (1)$$

As can be seen from Equation (1), the thickness of the sheath SHL has a positive correlation with the potential difference between the plasma PL and the lower electrode 16, and a negative correlation with the plasma density at the interface between the sheath SHL and the plasma PL. When the high-frequency power is reduced in order to increase the thickness of the sheath SHL, the density of the plasma at the interface between the sheath SHL and the plasma PL, that is, $n_s$ in Equation (1) is reduced. At the same time, the potential difference between the plasma PL and the lower electrode 16, that is, $V_0$ in Equation (1) also decreases. Accordingly, as illustrated in FIG. 8, even when the high-frequency power is reduced, the thickness of the sheath SHL cannot be significantly increased. Therefore, as illustrated in FIG. 8, even when the high-frequency power is reduced, an energy EG applied to the particles is small, and the particles cannot move to a lower end SUA of the sheath SHU between the plasma PL and the upper electrode 20, and can move only to a lower end SLA of the sheath SHL or to the vicinity thereof.

In contrast, in the process ST2 of the method MT, the phase of the voltage of the lower electrode 16 is relatively adjusted with respect to the phase of the voltage of the upper electrode 20 so as to increase the thickness of the sheath SHL between the support stage 14 and the plasma PL. By relatively adjusting the phase of the voltage of the lower electrode 16 with respect to the phase of the voltage of the upper electrode 20, it is possible to increase the potential difference between the plasma PL and the lower electrode 16, that is, $V_0$ in Equation (1) without substantially changing the density of the plasma at the interface between the sheath SHL and the plasma PL, that is, $n_s$ in Equation (1). Accordingly, with the method MT, as illustrated in FIG. 9, the thickness of the sheath SHL can be significantly increased without extinguishing the plasma PL generated for performing the plasma treatment in the process ST1. As a result, as illustrated in FIG. 9, as a large amount of energy EG is applied to the particles, the particles are significantly separated upward from the plasma-processed substrate W and move to the lower end SUA of the sheath SHU between the plasma PL and the upper electrode 20 or to the vicinity thereof. Therefore, with the method MT, the number of particles adhering to the plasma-processed substrate W is significantly reduced.

In the process ST2 of the present embodiment, the phase of the voltage of the lower electrode 16 is relatively adjusted with respect to the phase of the voltage of the upper electrode 20 by the phase adjustment circuit such that the sheath SHL has a thickness of 1.246 times or more the thickness of the sheath SHL during the process ST1 and before the process ST2. According to the present embodiment, it is possible to significantly increase a moving distance of particles.

Figure 10:
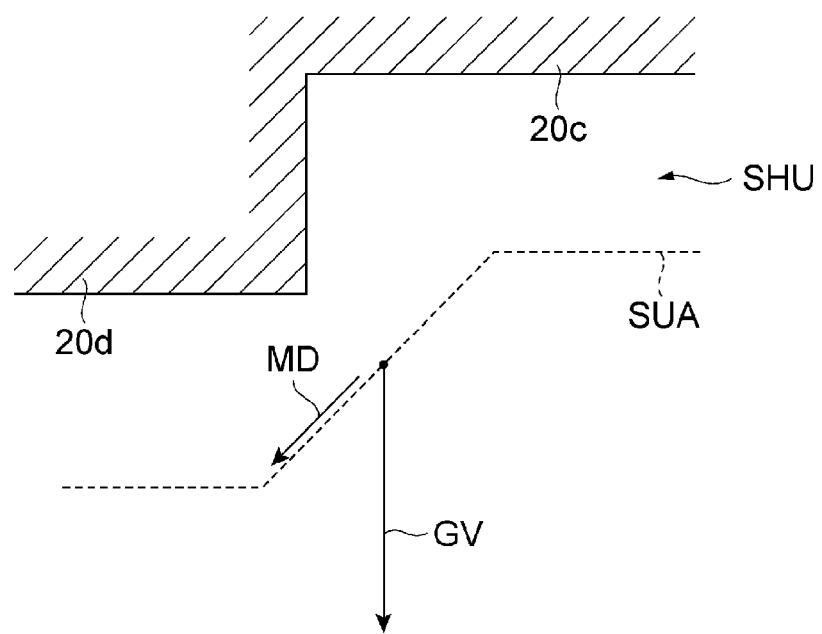
FIG. 10 is a view illustrating movement of particles in the vicinity of a second portion of an upper electrode.

In the present embodiment, the upper electrode 20 includes the first portion 20c and the second portion 20d described above. FIG. 10 is a view illustrating movement of particles in the vicinity of the second portion of the upper electrode. As illustrated in FIG. 10, the lower end SUA of the sheath SHU below the second portion 20d is located at a position lower in the vertical direction than the lower end SUA of the sheath SHU below the first portion 20c. Below the boundary between the first portion 20c and the second portion 20d, the lower end SUA of the sheath SHU is inclined downward. Below the boundary between the first portion 20c and the second portion 20d, particles receive a force moving in a direction MD due to the influence of the gravity GV. Accordingly, the particles separated upward from the substrate W further moves to a region outside a region above the support stage 14, and is then discharged. Therefore, the number of particles adhering to the plasma-processed substrate W is further significantly reduced.

Hereinafter, an experiment that was conducted for evaluation of the method MT will be described. The experiment described below do not limit the scope of the present disclosure.

In the experiment, the plasma processing apparatus 10A was used. Then, plasma was generated in the internal space 12s, and then, the thickness of the sheath SHL was increased by the phase adjustment circuit 28 without extinguishing the plasma. In the experiment, a laser beam was radiated toward the internal space 12s and an image of the internal space 12s was obtained. Then, a distance (hereinafter, referred to as a "moving distance") in which particles existing in the internal space 12s moved in the vertical direction before and after the increase in the thickness of the sheath SHL was obtained from the obtained image. As the particles, particles formed of $SiO_2$ and having a diameter of 1.5 μm were used. Other condition in the experiment is described below.
<Experimental Condition>
Flow rate of an Ar gas supplied to the internal space 12s: 100 sccm
Pressure in the internal space 12s: 4 Pa
Frequency of a high-frequency power generated by the high-frequency power supply 26A: 13.56 MHz FIG. 11 illustrates the result of the experiment. In the graph of FIG. 11, the horizontal axis represents an increase rate Δs (%) in the thickness of the sheath SHL. The increase rate Δs is a ratio of an amount of increase in the thickness of the sheath SHL to a thickness of the sheath SHL before increased. In the graph of FIG. 11, the vertical axis represents a ratio (%) of the moving distance of the particles to the distance between the upper electrode 20 and the support stage 14 (that is, a gap length). As illustrated in FIG. 11, when the increase rate Δs in the thickness of the sheath SHL was 24.6% or more, a large moving distance was measured. Accordingly, it was confirmed that by increasing, in the process ST2, the thickness of the sheath SHL to 1.246 times or more the thickness of the sheath SHL during the process ST1 and before the process ST2, it is possible to obtain a large moving distance of the particles, and thus significantly separate the particles from the substrate W.

Although various embodiments have been described above, various modifications can be made without being limited to the above-described embodiments. For example, in the plasma processing apparatus 10A, the high-frequency power supply 26A may be electrically connected to the lower electrode 16, and the phase adjustment circuit 28 may be connected to the upper electrode 20. In the plasma processing apparatus 10A, another high-frequency power supply may be electrically connected to the lower electrode 16, and the phase adjustment circuit 28 may be connected to one of the upper electrode 20 and the lower electrode 16. In addition, the plasma processing apparatus 10B may not include one of the phase adjustment circuit 281 and the phase adjustment circuit 282.

EXPLANATION OF REFERENCE NUMERALS 10A, 10B: plasma processing apparatus, 12: chamber body, 14: support stage, 16: lower electrode, 18: electrostatic chuck, 20: upper electrode, 22: gas supply, 24: exhaust device, 26A, 261: high-frequency power supply, 28, 281, 282: phase adjustment circuit

What is claimed is:
1. A plasma processing method performed in a plasma processing apparatus,
wherein the plasma processing apparatus comprises:
a chamber body;
a gas supply configured to supply a gas to an internal space provided in the chamber body;
a support stage including a lower electrode and being provided in the internal space, the support stage being configured to support a substrate placed on the support stage;
an upper electrode provided above the support stage;
a high-frequency power supply configured to supply a high-frequency power so as to generate plasma in the internal space;
a phase adjustment circuit configured to relatively adjust a phase of a voltage of the lower electrode with respect to a phase of a voltage of the upper electrode; and
an exhaust device provided so as to be in communication with the internal space,
wherein the plasma processing method is performed in a state in which the substrate is placed on the support stage,
wherein the plasma processing method comprises:
a process of performing a plasma treatment on the substrate, in which the gas is supplied from the gas supply to the internal space, and the high-frequency power is supplied from the high-frequency power supply so as to excite the gas to generate plasma, such that the plasma treatment is performed;

a process of relatively adjusting the phase of the voltage of the lower electrode with respect to the phase of the voltage of the upper electrode by the phase adjustment circuit, such that a thickness of a sheath between the support stage and the plasma is increased without extinguishing the plasma generated in the process of performing the plasma treatment; and a process of discharging gases and particles in the internal space using the exhaust device, after the process of adjusting the phase is performed and in a state in which supply of the high-frequency power is stopped, wherein, in the process of adjusting the phase, the phase of the voltage of the lower electrode is relatively adjusted with respect to the phase of the voltage of the upper electrode by the phase adjustment circuit, such that the sheath has a thickness of 1.246 times or more of a thickness of the sheath during the process of performing the plasma treatment and before the process of adjusting the phase.

2. The plasma processing apparatus of claim 1, wherein the upper electrode includes a first portion extending above the support stage and a second portion extending above a space between the support stage and a sidewall of the chamber body, and wherein the second portion protrudes downward with respect to the first portion.

\* \* \* \* \*